(12) United States Patent
Chen et al.

(10) Patent No.: US 6,686,667 B2
(45) Date of Patent: Feb. 3, 2004

(54) IMAGE SENSOR SEMICONDUCTOR PACKAGE WITH CASTELLATION

(75) Inventors: James Chen, Taipei (TW); Rong-Huei Wang, Hsinchu (TW)

(73) Assignee: Scientek Corp., Hsinchu Shien (TW)

( * ) Notice: Subject to any disclaimer, the term of this patent is extended or adjusted under 35 U.S.C. 154(b) by 0 days.

(21) Appl. No.: 10/128,276

(22) Filed: Apr. 24, 2002

(65) Prior Publication Data

US 2003/0201507 A1 Oct. 30, 2003

(51) Int. Cl.[7] .................. H01L 23/02; H01L 23/12; H01L 23/10; H01L 23/28
(52) U.S. Cl. .................. 257/787; 257/680; 257/704; 257/710; 257/734
(58) Field of Search .................. 257/706, 734, 257/680, 698, 787, 433, 796, 704

(56) References Cited

U.S. PATENT DOCUMENTS

| | | | | |
|---|---|---|---|---|
| 5,523,608 A | * | 6/1996 | Kitaoka et al. | 257/433 |
| 5,900,581 A | * | 5/1999 | Ootake | 174/52.2 |
| RE36,773 E | * | 7/2000 | Nomi et al. | 361/760 |
| 6,143,588 A | * | 11/2000 | Glenn | 438/116 |
| 6,191,477 B1 | * | 2/2001 | Hashemi | 257/706 |
| 6,201,346 B1 | * | 3/2001 | Kusaka | 313/504 |
| 6,274,927 B1 | * | 8/2001 | Glenn | 257/680 |
| 6,392,309 B1 | * | 5/2002 | Wataya et al. | 257/796 |
| 6,483,184 B2 | * | 11/2002 | Murata | 257/698 |
| 2001/0042915 A1 | * | 11/2001 | Su et al. | 257/734 |

* cited by examiner

*Primary Examiner*—Jerome Jackson
*Assistant Examiner*—Jesse A. Fenty
(74) *Attorney, Agent, or Firm*—Rosenberg, Klein & Lee

(57) ABSTRACT

A non-ceramic image sensor semiconductor package with improved moisture resistance, lower cost, and higher reliability is provided. A semiconductor chip with a vision chip active area is attached to a multi-layer resin mask organic substrate. A plurality of bonding wires are attached between parts of the semiconductor chip and the multi-layer resin mask organic substrate to create selective electrical connections. A castellation is formed to create a riser surrounding the semiconductor chip. The height of the castellations can be made to a desired height so that proper clearance of the semiconductor chip and the glass window is achieved. A transparent window is placed on the top of the castellations. A liquid encapsulant is formed to protectively seal the non-ceramic image sensor semiconductor package thereby shielding the semiconductor chip and vision chip active area from the external environment. Because the same or similar materials are used in the package, the adhesion between these parts is very strong, thus providing a highly reliable device at a lower cost.

21 Claims, 1 Drawing Sheet

IMAGE SENSOR SEMICONDUCTOR PACKAGE WITH CASTELLATION

BACKGROUND OF THE INVENTION

1. Field of the Invention

The present invention relates to a semiconductor package. More specifically, the present invention discloses a non-ceramic image sensor semiconductor package having a vision chip and a transparent window supported by a castellation.

2. Description of the Prior Art

Image sensors are used in a wide variety of electronic devices. These electronic devices rely on highly reliable and low cost image sensor devices. However, conventional image sensor devices are prone to failure and are relatively expensive to manufacture.

The conventional device basically consists of a ceramic housing with electrical leads protruding through the sides of the ceramic housing. Once a chip has been attached inside the housing, a glass cover is glued to the top of the housing. The glass cover is essentially the same size as the ceramic housing.

The conventional device as described above, has several disadvantages. For example, the glass cover can easily separate from the ceramic package. As a result, the chip is exposed to the external environment thereby destroying the device. Another problem is that moisture can enter the package which causes condensation on the inside of the glass thus degrading the image capturing ability and quality of the chip. Furthermore, the ceramic material used in the conventional device is relatively expensive.

Therefore, there is need for an improved image sensor semiconductor package with improved moisture resistance, lower cost, and higher reliability.

SUMMARY OF THE INVENTION

To achieve these and other advantages and in order to overcome the disadvantages of the conventional device in accordance with the purpose of the invention as embodied and broadly described herein, the present invention provides a non-ceramic image sensor semiconductor package having a vision chip and transparent window with improved moisture resistance, higher reliability, and lower production cost.

A concern with image sensor semiconductor devices is moisture resistance. If moisture is allowed to enter the device, condensation will form on the glass window, semiconductor chip, or vision chip active area. Conventional devices are susceptible to such moisture problems. However, in the present invention, the flatness of the substrate, the similarity of the materials and properties, and the greater adhesion between materials, provides for a highly reliable and moisture resistant image sensor device.

In addition, the ceramic material of the conventional device is more expensive than the organic material utilized in the image sensor semiconductor device of the present invention. Therefore, an advantage of the present invention is the benefit of reduced production cost.

Conventional ceramic image sensor devices have several disadvantages. For example, the ceramic material used in producing the device is relatively expensive. In addition, moisture can enter the device causing condensation to form inside the part thus degrading the image sensing performance of the device. Furthermore, the glass cover can easily separate from the ceramic package as it is only held onto the ceramic package with glue. As a result, the chip is exposed to the external environment thereby destroying the device.

However, the present invention provides a non-ceramic image sensor semiconductor package with improved moisture resistance, lower cost, and higher reliability.

The non-ceramic image sensor semiconductor device comprises a multi-layer resin mask organic substrate, a semiconductor chip with a vision chip active area, conductive wires, a castellation, a transparent window, and encapsulant.

The multi-layer resin mask organic substrate is a substrate comprising a resin mask material and a resin substrate material of the same material. Utilizing the same materials allows the substrate to be extremely flat. The circuit traces of the resin mask in the substrate material are even, thus providing a very flat substrate surface. Therefore, there is better placement of the semiconductor chip and greater adhesion between the semiconductor chip and the substrate.

In contrast, other types of substrates are often inferior as the resultant substrate is not flat. In these substrates, the mask material is raised slightly above the substrate material, making the face of the substrate uneven and not flat. As a result, in integrated circuit using these substrates, properties such as adhesion between the semiconductor chip and the substrate, are inferior.

The semiconductor chip is bonded, for example, adhesively bonded, to the multi-layer resin mask organic substrate by means of an adhesive.

The semiconductor chip comprises a vision chip active area. The vision chip may be contained as a part of the semiconductor chip or separate. The vision chip can be a complementary metal oxide semiconductor (CMOS) or a charge-coupled device (CCD) vision chip.

A plurality of conductive means are bonded or attached between conductive contacts or traces on the active side of the semiconductor chip and the multi-layer resin mask organic substrate. The conductive means comprise, for example, gold bonding wires.

The conductive means are utilized to create selective electrical connections between conductive contacts, pads, or traces on the semiconductor chip and the multi-layer resin mask organic substrate.

Castellations are formed to create risers surrounding the semiconductor chip. The height of the castellation can be made to a desired height so that proper clearance of the semiconductor chip and the vision chip active area and the glass window. is achieved. The castellations are made of, for example, substrate material or elastomer and may be silicon coated. An advantage of the present invention is that by using a material for the castellations that is the same or similar to the material of the organic substrate, the physical properties of the two will be similar thereby making the adhesion stronger between the organic substrate and the castellations.

After the castellation has been formed, a transparent window is placed on the top of the castellation. The transparent window comprises, for example, a boro-silicate glass window.

A liquid encapsulant is formed to cover desired areas and portions of the multi-layer resin mask organic substrate, castellation, and the glass window. Preferably, the encapsulant does not cover more of the glass window than is supported by the castellations.

The encapsulant is formed by, for example, printing. The encapsulant adhesively fixes and protectively seals the non-ceramic image sensor semiconductor package thereby shielding the semiconductor chip and vision chip active area from the external environment. Additionally, since the substrate is a resin mask organic substrate and very flat, the adhesion between the substrate and the encapsulant is very strong.

In addition, the transparent window may be placed on the castellation in the same production process as the encapsulant. In this way, additional processing steps are eliminated and production costs are lowered.

Therefore, the present invention provides a non-ceramic image sensor semiconductor package having a vision chip and grass window with improved moisture resistance, lower cost, and higher reliability.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification.

The drawings illustrate embodiments of the invention and, together with the description, serve to explain the principles of the invention. In the drawings.

DESCRIPTION OF THE PREFERRED EMBODIMENTS

Figure 1:
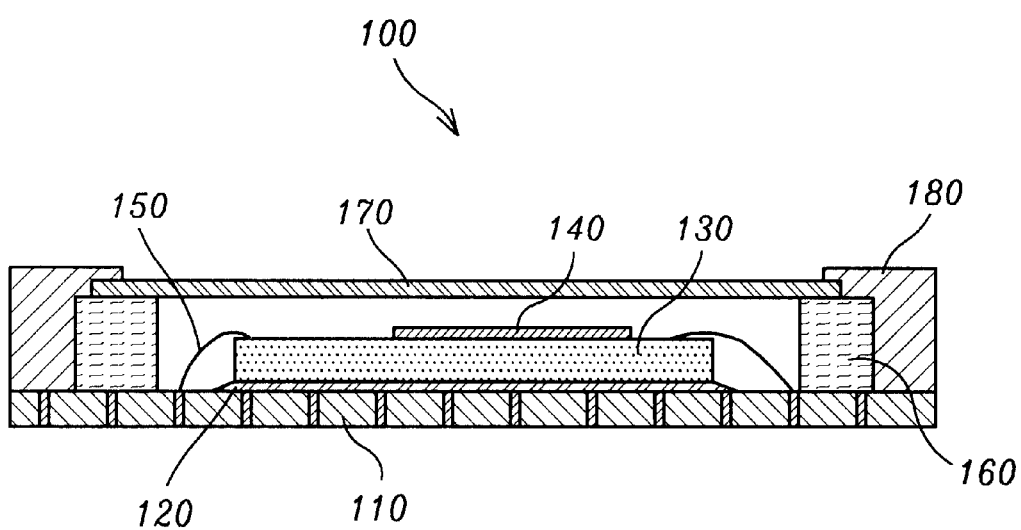
FIG. 1 is a sectional view showing the construction of a non-ceramic image sensor semiconductor package in accordance to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

As described above, the conventional ceramic image sensor device has several disadvantages. For example, the ceramic material used in producing the device is relatively expensive. In addition, moisture can enter the device causing condensation to form inside the part thus degrading the image sensing performance of the device. Furthermore, the glass cover can easily separate from the ceramic package as it is only held onto the ceramic package with glue. As a result, the chip is exposed to the external environment thereby destroying the device.

However, the present invention provides a non-ceramic image sensor semiconductor package with improved moisture resistance, lower cost, and higher reliability.

Refer to FIG. 1, which is a sectional view showing the construction of a non-ceramic image sensor semiconductor package in accordance to an embodiment of the present invention.

The non-ceramic image sensor semiconductor device 100 comprises a multi-layer resin mask organic substrate 110, a semiconductor chip 130, a vision chip active area 140, conductive wires 150, castellations 160, a transparent window 170, and encapsulant 180.

The multi-layer resin mask organic substrate 110 is a substrate comprising a resin mask and an organic substrate of the same material. Utilizing the same materials allows the substrate to be extremely flat. The circuit traces formed by the resin mask that are in the substrate material are even, thus providing a very flat substrate surface. Therefore, there is better placement of the semiconductor chip 130 and greater adhesion between the semiconductor chip 130 and the substrate 110.

In contrast, other types of substrates are often inferior as the resultant substrate are often not flat. In these substrates, the traces are raised slightly above the substrate material, making the face of the substrate uneven and not flat. As a result, in an integrated circuit using other types of substrates, the physical and mechanical properties such as adhesion between the semiconductor chip and the substrate, are inferior.

Note, in this embodiment of the present invention, the resin mask organic substrate is multi-layered. However, a single layer resin mask organic substrate is disclosed in other embodiments of the present invention.

A semiconductor chip 130 is bonded, for example, adhesively bonded, to the multi-layer resin mask organic substrate 110 by means of an adhesive 120. Note that for clarity only one semiconductor chip is given by way of example. In other embodiments of the present invention, multiple semiconductor chips are utilized within the same semiconductor package.

The semiconductor chip 130 comprises a vision chip active area 140. The vision chip active area may be comprised as a part of the semiconductor chip 130 or separate. The vision chip 140 can be a complementary metal oxide semiconductor (CMOS) or a charge-coupled device (CCD) vision chip.

A plurality of conductive means 150 are bonded or attached between conductive contacts or traces on the active side of the semiconductor chip 130 and the multi-layer resin mask organic substrate 110. The conductive means 150 comprise, for example, gold bonding wires.

The conductive means 150 are utilized to create selective electrical connections between conductive contacts, pads, or traces on the semiconductor chip 130 and traces or contacts of the multi-layer resin mask organic substrate 110.

A castellation 160 is formed to create a riser surrounding the semiconductor chip 130. The height of the castellation 160 can be made to a desired height so that proper clearance of the semiconductor chip 130 and the vision chip active area 140 and the glass window 170 is achieved. The castellation 160 is made of, for example, substrate material or elastomer and may be silicon coated. An advantage of the present invention is that by using a material for the castellations 160 that is the same or similar to the material of the organic substrate 110, the physical properties of the two will be similar thereby making the adhesion stronger between the organic substrate 110 and the castellations 160.

After the castellation 160 has been formed, a transparent window 170 is placed on the top of the castellations 160. The transparent window 170 comprises, for example, a borosilicate glass window, other transparent material, or a lens.

A liquid encapsulant 180 is formed to cover desired areas and portions of the multi-layer resin mask organic substrate 110, castellations 160, and the glass window 170. In an embodiment of the present invention, the encapsulant 180 does not cover more of the glass window 170 than is supported by the castellation 160.

The encapsulant 180 is formed by, for example, printing. The encapsulant 180 adhesively fixes and protectively seals the non-ceramic image sensor semiconductor package 100 thereby shielding the semiconductor chip 130 and vision chip active area 140 from the external environment. Additionally, since the substrate 110 is a resin mask organic substrate and very flat, the adhesion between the substrate 110 and the encapsulant 180 is very strong.

In addition, the transparent window may be placed on the castellation in the same production process as the encapsulant. In this way, additional processing steps are eliminated and production costs are lowered.

After encapsulation, the image sensor semiconductor package can be finished by conventional processing methods to complete the device if needed. For example, depending on packaging type, preparing contact areas for inputs and outputs of electrical signals to the semiconductor device.

Although the embodiment shown above comprises a particular type of package, other package types are used in other embodiments of the present invention.

For example, in embodiments of the present invention the package type is ball grid array (BGA), leadless chip carrier (LCC), quad flat pack (QFP), and quad flat no-lead (QFN) package types, or other package types.

A major concern with image sensor semiconductor devices is moisture resistance. If moisture is allowed to enter the device, condensation will form on the glass window. semiconductor chip, or vision chip active area. Conventional devices are susceptible to such moisture problems. However, in the present invention, the flatness of the substrate, the similarity of the materials and properties, and the greater adhesion between materials, provides for a highly reliable and moisture resistant image sensor device.

In addition, the ceramic material of the conventional device is more expensive than the organic material utilized in the image sensor semiconductor device of the present invention. Therefore, an advantage of the present invention is the benefit of reduced production cost.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An image sensor semiconductor package comprising;
   a substrate formed of a resin mask organic material;
      whereby a plurality of conductive traces arc formed in the resin mask organic substrate forming a circuit pattern;
   a semiconductor chip attached to the resin mask organic substrate;
   whereby the semiconductor chip comprises a vision chip active area;
   a plurality of conductive members electrically coupled to conductive portions of the semiconductor chip and the conductive traces of the resin mask organic substrate;
   a castellation formed on the resin mask organic substrate around the semiconductor chip;
   a transparent window on top of the castellation; and
   an encapsulant covering selected areas of the resin mask organic substrate, the castellation, and the window, the encapsulant overlapping a pheripheral top portion of the transparent window and the castellation;
      the encapsulant and the castellation not touching or covering a part of the plurality of conductive members; and
      the castellation, encapsulant, and resin mask organic material comprise the same material.

2. The image sensor semiconductor package of claim 1, whereby the castellation has a height greater than the semiconductor chip and the plurality of conductive means.

3. The image sensor semiconductor package of claim 1, whereby the encapsulant does not cover more of the transparent window edge than is supported by the castellation.

4. The image sensor semiconductor package of claim 1, whereby the plurality of conductive means comprises bonding wires.

5. The image sensor semiconductor package of claim 1, whereby the resin mask organic substrate comprises a multi-layer resin mask organic substrate.

6. The image sensor semiconductor package of claim 1, whereby the transparent window is glass.

7. The image sensor semiconductor package of claim 1, whereby the transparent window comprises a lens.

8. The image sensor semiconductor package of claim 1, whereby the semiconductor chip comprises a complementary metal oxide semiconductor vision chip.

9. The image sensor semiconductor package of claim 1, whereby the semiconductor chip comprises a charge-coupled device vision chip.

10. The image sensor semiconductor package of claim 1, whereby the package type is a quad flat no-lead package type.

11. The image sensor semiconductor package of claim 1, whereby the package type is a leadless chip carrier package type.

12. The image sensor semiconductor package of claim 1, whereby the package type is a ball grid array package type.

13. An image sensor semiconductor package comprising;
   a multi-layer substrate formed of a resin mask organic material;
      whereby a plurality of conductive traces are formed in the resin mask organic substrate forming a circuit pattern;
   a semiconductor chip adhesively bonded to the multi-layer resin mask organic substrate;
      whereby the semiconductor chip comprises a vision chip active area;
   a plurality of bonding wires respectively coupled to conductive portions of the semiconductor chip and the traces in the multi-layer resin mask organic substrate;
   a castellation formed on the multi-layer resin mask organic substrate;
      the castellation surrounding a perimeter of the semiconductor chip leaving the vision chip active area exposed;
      whereby the castellation is taller than the semiconductor chip and the plurality of bonding wires;
   a transparent window attached to a top side of the castellation and covering the semiconductor chip and the vision chip active area; and
   an encapsulant covering selected areas of the multi-layer resin mask organic substrate, the castellation, and the transparent window, the encapsulant overlapping a peripheral top portion of the transparent window and the castellation;
      the encapsulant and the castellation not touching or covering a part of the plurality of conductive members; and
      the castellation, encapsulant, and resin mask organic material comprise the same material;

whereby the encapsulant protectively seals the image sensor semiconductor package.

14. The image sensor semiconductor package of claim 13, whereby the encapsulant does not cover more of the transparent window edge than is supported by the castellation.

15. The image sensor semiconductor package of claim 13, whereby the transparent window is glass.

16. The image sensor semiconductor package of claim 13, whereby the transparent window comprises a lens.

17. The image sensor semiconductor package of claim 13, whereby the semiconductor chip comprises a complementary metal oxide semiconductor vision chip.

18. The image sensor semiconductor package of claim 13, whereby the semiconductor chip comprises a charge-coupled device vision chip.

19. The image sensor semiconductor package of claim 13, whereby the package type is a quad flat no-lead package type.

20. The image sensor semiconductor package of claim 13, whereby the package type is a leadless chip carrier package type.

21. The image sensor semiconductor package of claim 13, whereby the package type is a ball grid array package type.

* * * * *